(12) United States Patent
Seefeldt et al.

(10) Patent No.: US 7,323,946 B2
(45) Date of Patent: Jan. 29, 2008

(54) LOCK DETECT CIRCUIT FOR A PHASE LOCKED LOOP

(75) Inventors: James D. Seefeldt, Eden Prairie, MN (US); Bradley A. Kantor, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 76 days.

(21) Appl. No.: 11/254,569

(22) Filed: Oct. 20, 2005

(65) Prior Publication Data

US 2007/0090887 A1 Apr. 26, 2007

(51) Int. Cl.
*H03L 7/085* (2006.01)
*H03L 7/08* (2006.01)

(52) U.S. Cl. .................. 331/25; 331/1 A; 331/DIG. 2; 327/7; 327/157

(58) Field of Classification Search .................. 331/18, 331/25, 1 A, DIG. 2; 327/156, 157, 2, 3, 327/5, 7, 39, 40, 41, 42, 43
See application file for complete search history.

(56) References Cited

U.S. PATENT DOCUMENTS

| | | | |
|---|---|---|---|
| 4,122,405 A * | 10/1978 | Tietz et al. | 331/1 A |
| 4,479,091 A | 10/1984 | Yoshisato | |
| 4,929,916 A * | 5/1990 | Fukuda | 331/1 A |
| 6,121,849 A * | 9/2000 | McCollough et al. | 331/175 |
| 6,256,362 B1 | 7/2001 | Goldman | |
| 6,441,691 B1 | 8/2002 | Jones et al. | |
| 6,683,930 B1 | 1/2004 | Dalmia | |
| 6,856,202 B2 | 2/2005 | Lesso | |
| 6,950,957 B1 * | 9/2005 | O'Leary | 713/401 |

OTHER PUBLICATIONS

U.S. Appl. No. 11/254,474, filed Oct. 20, 2005, James D. Seefeldt.
U.S. Appl. No. 11/254,281, filed Oct. 20, 2005, Jeffrey J. Kriz.
U.S. Appl. No. 11/254,473, filed Oct. 20, 2005, James D. Seefeldt.
U.S. Appl. No. 11/254,466, filed Oct. 20, 2005, James D. Seefeldt.
Dong Pan, et al, "A Radiation-Hard Phase-Locked Loop," IEEE 2003, pp. 1-6.
Nosaka, Hideyuki, et al., "A 39-to-45-Gbit/s Multi-Data-Rate Clock and Data Recovery Circuit With a Robust Lock Detector," IEEE Journal of Solid-State Circuits, vol. 39, No. 8, Aug. 2004, pp. 1361-1365.

* cited by examiner

*Primary Examiner*—Robert Pascal
*Assistant Examiner*—Ryan J Johnson
(74) *Attorney, Agent, or Firm*—McDonnell Boehnen Hulbert and Berghoff LLP

(57) ABSTRACT

An improved system and method for determining the lock condition of a Phase Locked Loop (PLL) is described. The lock detect circuit generates a fast lock detect signal that may be used to detect a transient loss of lock. The lock detect circuit may also include a phase alignment detect circuit to detect a misalignment in the phase of a reference clock and a feedback clock. Additionally, the lock detect circuit may include a reference clock detect circuit to detect if the reference clock signal is detected. Output signals from all of the above circuits may be communicated to a logic circuit in order to create an enhanced lock detect signal. An extended lock detect signal may also be communicated to the logic circuit.

24 Claims, 8 Drawing Sheets

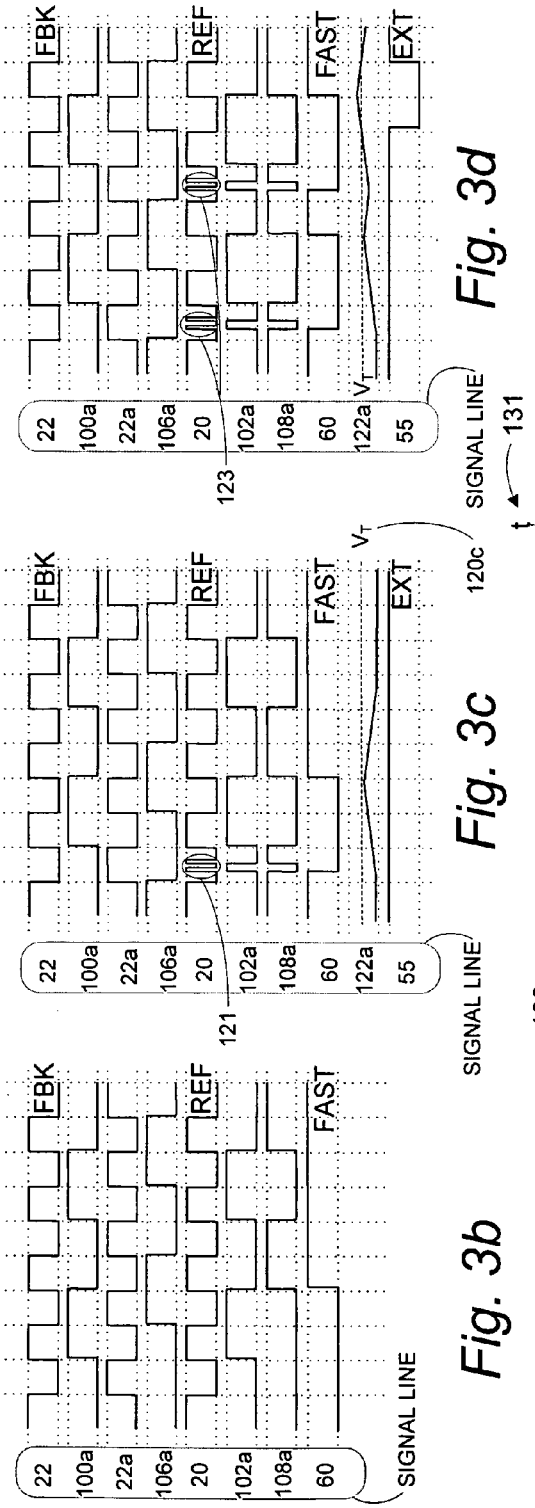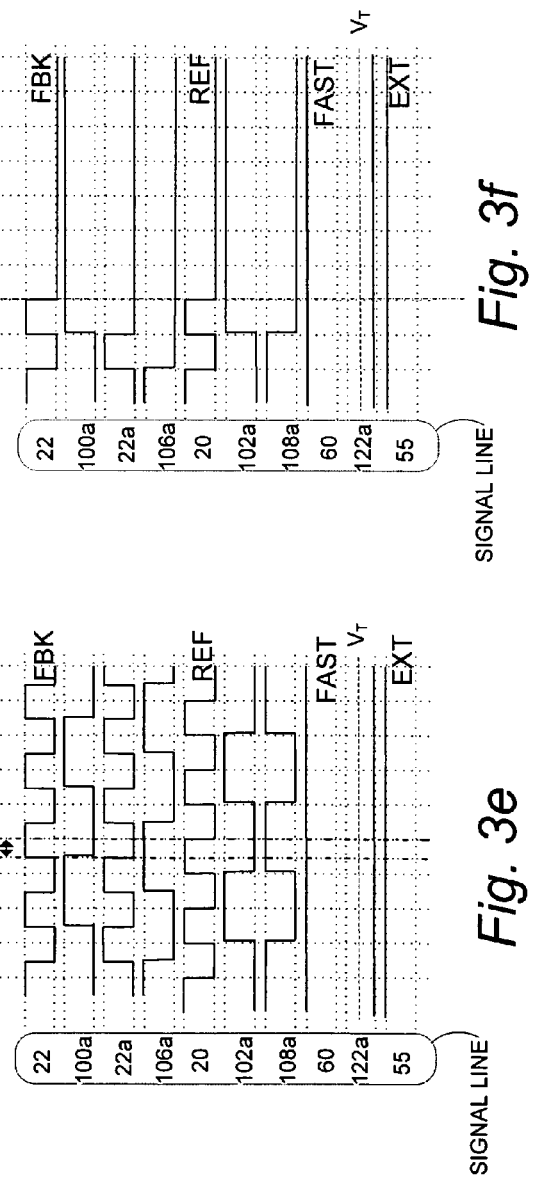

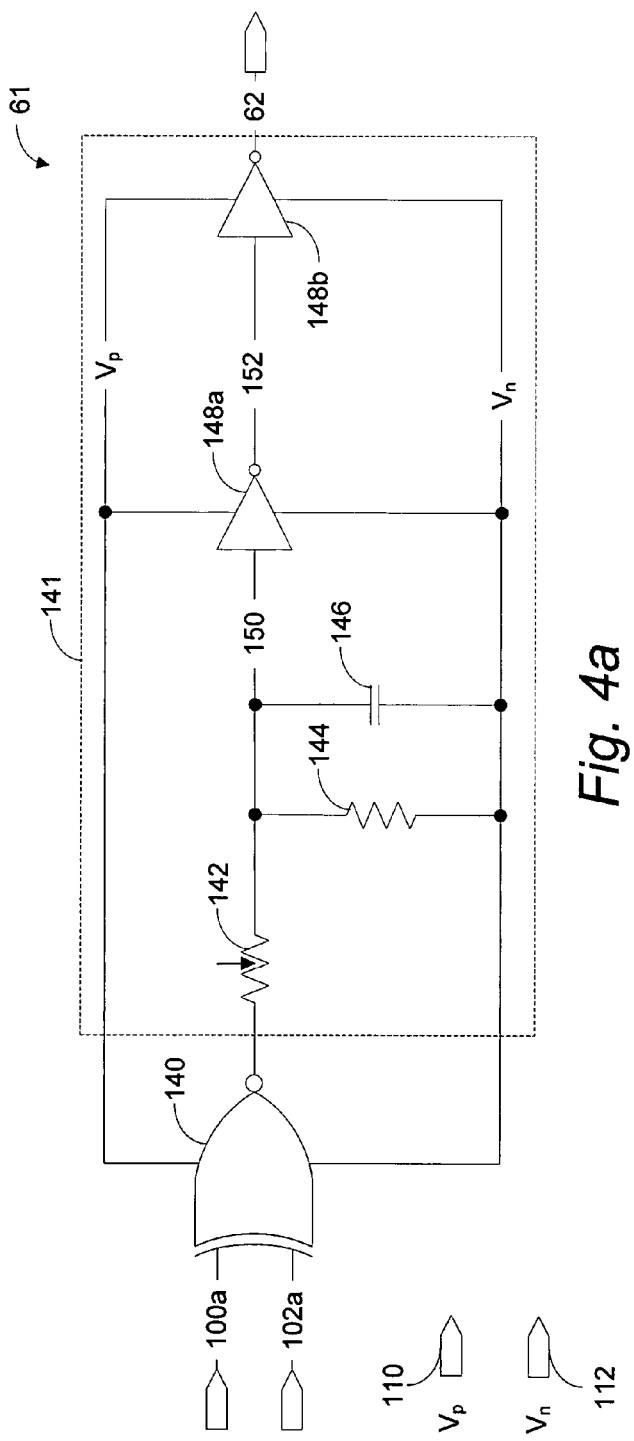
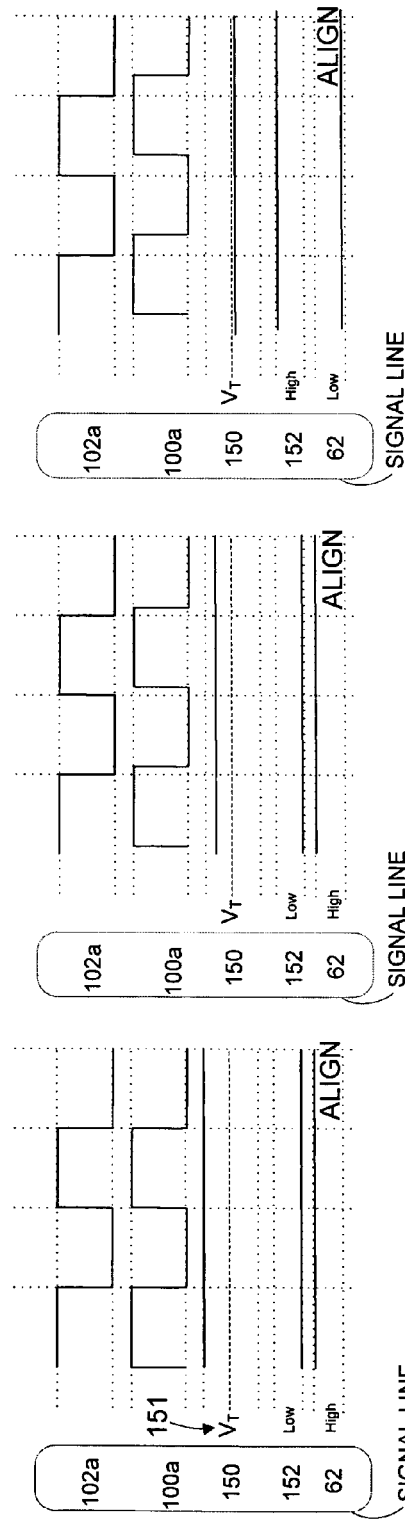
Fig. 4a
Fig. 4b
Fig. 4c
Fig. 4d

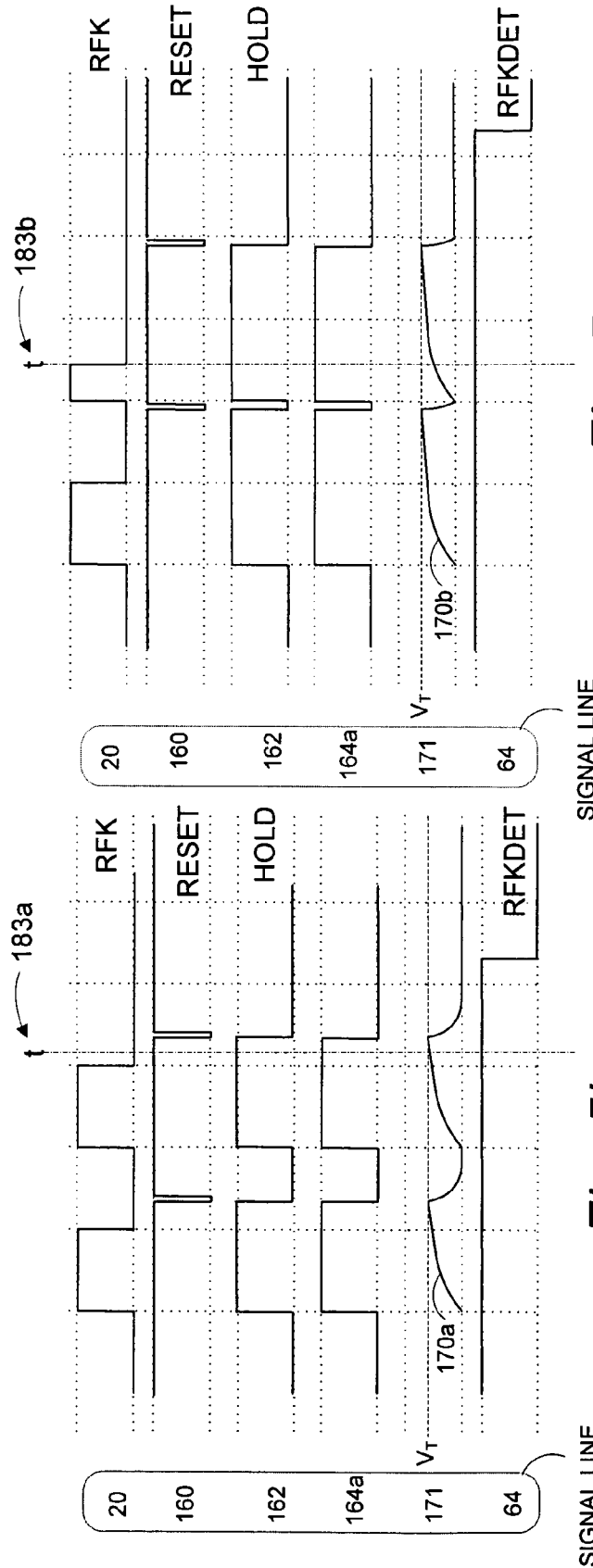

LOCK DETECT CIRCUIT FOR A PHASE LOCKED LOOP

GOVERNMENT RIGHTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to alignment of periodic signals, and more particularly, the lock detection of aligned or locked signals provided by phase locked loops, delay locked loops, clock and data recovery circuits, etc.

BACKGROUND

Phase locked loops (PLLs) have been used extensively in analog electrical systems and communication systems. In today's high performance systems operating within increasingly stringent timing constraints, PLLs are being introduced in more general digital electronic circuits. For example, application specific integrated circuits (ASICs) are used in a variety of circuit applications typically include on-chip PLLs for clock signal distribution.

The key advantages that PLLs bring to clock distribution are phase/delay compensation, frequency multiplication and duty cycle correction. A PLL enables one periodic signal or clock to be phase-aligned to and/or frequency multiples of a reference clock. As the name implies, the output of the PLL locks onto the incoming reference clock signal and generates a periodic output signal with a frequency equal to the average frequency of the reference clock. When the output PLL signal tracks the reference signal, the PLL is said to be "locked."

A PLL, however, will only remain locked over a limited frequency range or shift in frequency called a hold-in or lock range. The PLL generally tracks the reference signal over the lock range, provided the reference frequency changes slowly. This maximum "locked sweep rate" is the maximum rate of change of the reference frequency for which the PLL will remain locked. If the frequency changes faster than this rate, the PLL will drop out of lock.

Other factors may cause loss of lock that may occur unexpectedly and suddenly. For example, single event transients caused by particle radiation (not uncommon in aerospace applications) may disrupt the PLL circuit and cause loss of lock. Integrated circuits used in space, weapons, or aviation applications are more likely to be exposed to such charged particle radiation. Solid-state integrated circuits can be vulnerable to disturbances caused by a single, charged particle. Particle-induced circuit disturbances are random and are commonly referred to as single-event effects (SEEs). SEEs can take on many forms. If the particle strike results in a bit flip or other form of corruption of stored data, this is known as a single-event upset (SEU), or a soft error. If the particle causes a transient voltage disturbance on a node of a logic circuit, this is known as a single-event transient (SET). If the node is in a clock network, a temporary voltage disturbance on a circuit node can generate a false clock pulse in a portion of the system. If undetected, loss of lock may disrupt and interfere with circuit operation.

To detect a loss of lock, lock detectors are utilized. Lock detectors typically monitor the reference clock and the PLL output to compare the frequencies of the two signals. If the frequencies match, the PLL is determined to be locked. Unfortunately, conventional lock detect circuits have several drawbacks. One drawback is that typical lock detect circuits may not indicate the disruption of the reference clock. The reference clock can be disrupted for a number of cycles by, for example, a SEU. Conventional lock detection schemes, however, do not detect transient loss of the reference clock. Disruptions that occur for only a few clock cycles may not give a lock detector enough time to detect that a clock has been disrupted. In some instances, this slow response may be attributed to a filter within a lock detector that is used to reduce noise or "jitter" in a lock detect signal.

Although the use of filtering techniques may be useful in creating a steady lock detect output, the filtered signal increases the lock detect signal response time. For example, if a SET occurs, a reference clock may only be disrupted for a few clock cycles. In a few clock cycles, only a small amount of charge may discharge from the filter within a lock detector before the reference clock recovers and the filter begins to accumulate charge again. A SET, or other transient event, may not have been detected despite its actual occurrence.

In addition, some lock detect circuits will not detect a transient loss or even a total loss of reference clock, particularly if the lock detect circuit employs logic that evaluates the PLL derived clock and not the reference clock. In this case, the lock detect signal will correspond to a lock condition when a PLL clock may not even be generated. In some cases, lock detect circuits that lose a reference clock may continue to produce a PLL clock output. A clock output may continue to increase or decrease in frequency until a voltage controlled oscillator (VCO) within the PLL is pinned at a low or high frequency that may be outside the operating range of circuits using the PLL clock output. If a PLL clock output deviates outside of normal operating range, undesirable results may occur in the circuits using the PLL clock output.

Furthermore, another disadvantage to conventional lock detect circuits is that they cannot identify small deviations in phase misalignment. Typically, lock detectors cannot identify phase misalignment until they approach the order of 60 degrees or more. For integrated circuit applications that require phase synchronization, not detecting phase alignment may also be detrimental.

Overall, as discussed above, conventional lock detectors fail in three primary areas: failure to account for rapid loss and recovery of a lock signal, loss of reference clock, or phase error. Not accounting for these factors in PLLs may cause errors in an integrated circuit device. For example, a SEU disruption in a PLL generated clock cycle may cause an error condition in a timing cell within an ASIC. The ASIC may malfunction and the cause of the error may not be corrected without causing the ASIC itself to be reset. Performing a reset of the entire ASIC could be detrimental to systems relying on the ASIC, including the systems used in the applications identified above (e.g., Space, weapons, or aviation applications). However, if the PLL generated clock cycle was designed to detect SET or SEU errors, a feedback signal from a lock detect circuit could reset the timing device within the ASIC and avoid resetting the entire ASIC. The ASIC could then continue operating in a desired manner, thereby avoiding a detrimental impact to applications that rely on the ASIC. Thus, there is a need for an improved PLL lock detector.

SUMMARY

An improved system and method for determining the lock condition of a Phase Locked Loop (PLL) is presented. The lock detect circuit includes a fast loss of lock detect circuit that generates a fast lock detect signal. This signal may be used to determine Single Event Effects (SEE), such as Single Event Transients (SETs) or Single Event Upsets (SEUs). The lock detect circuit may also include components to accurately detect the phase mismatch of signals. A phase detect signal, representing a phase error, may be generated. In addition to the above signals, an extended lock detect signal may also be generated. The extended lock detect signal represents a steady state lock condition is met. In one example, all the lock detect features are combined to form an enhanced lock detect signal. All of the lock detect signals may be used in order to determine a lock condition, or status. In other examples, a limited set of lock detect features may be chosen to determine lock status.

In another example, a reference clock detect signal is generated by communicating the reference clock to a one shot (or a "hold" circuit and a "reset" circuit) and a filter. If a reference clock signal is lost, the output of the circuit will go low. The reference clock detect signal may also undergo logic operation with other signals, such as the fast or extended lock detect signals to produce a combined lock detect signal.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Presently preferred examples are described below in conjunction with the appended drawing figures, wherein like reference numerals refer to like elements in the various figures, and wherein:

FIG. 3b is a timing diagram illustrating fast lock detect signal generation;

FIG. 3c is a timing diagram illustrating an example of a fast lock detect signal detected and an extended lock detect signal not detected;

FIG. 3d is a timing diagram illustrating fast and extended lock detect signal generation;

FIG. 3e is a timing diagram illustrating phase misalignment insensitivity in a lock detect circuit;

FIG. 3f is a timing diagram illustrating a loss of reference clock not being detected by a lock detect circuit;

FIG. 4a is a circuit diagram of a phase alignment detect circuit;

FIG. 4b is a timing diagram illustrating a phase alignment detect signal;

FIG. 4c is a timing diagram illustrating phase tolerance in the phase alignment detect signal;

FIG. 4d is a another timing diagram illustration of a phase alignment detect signal;

FIG. 5b is a timing diagram illustrating a lost reference clock on a low cycle;

FIG. 5c is a timing diagram illustrating a lost of reference clock on a high cycle;

DETAILED DESCRIPTION

As presented above, there is a need for an enhanced lock detect circuit to be used in a PLL. Conventional lock detect circuits fail to provide adequate detection of Single Event Effects (SEE) such as a Single Event Upset (SEU) or a Single Event Transient (SET). An enhanced lock detect circuit is presented that is capable of detecting SEU and SET events such as transient loss of a reference clock, complete loss of a reference clock or misalignment in phase.

Accordingly, the enhanced lock detect circuit may include a fast and an extended loss of lock detection circuit, a loss of reference clock detection circuit and a phase misalignment detection circuit. Depending on the application, any one of these circuits may be input a lock detect logic circuit to generate an enhanced lock detect signal. An extended lock detect signal may also be input into the lock detect logic circuit. The lock detect signal may be generated by performing a logical AND operation within the lock detect logic circuit or by performing other logical operations. In addition the enhanced lock detect signal may be a single bit, high or low value or it may be a multi-bit signal corresponding to various conditions within the enhanced lock detect circuit or the lock status of a PLL.

Figure 1A:
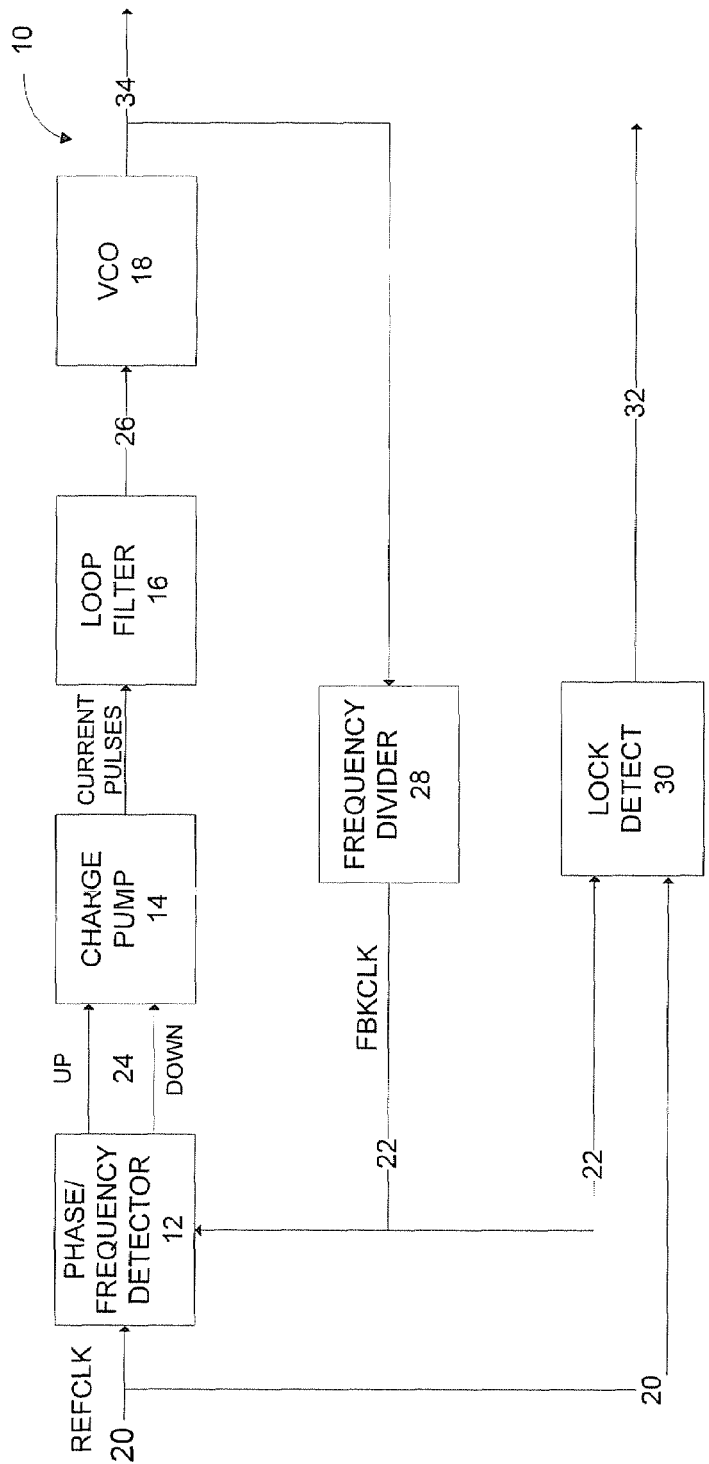
FIG. 1a is a block diagram of a Phase Locked Loop (PLL)

Turning now to FIG. 1a, a basic PLL 10 may include a phase-frequency detector 12, a charge pump 14, a loop (low pass) filter 16, a Voltage Controlled Oscillator (VCO) 18 and a lock detector 30. The phase-frequency detector 12 receives a reference clock signal (REFCLK) on signal line 20 and a derived (or feedback) clock signal FBKCLK on signal line 22. The output of the phase-frequency detector 12 is supplied to the charge pump 14. The output of the charge pump 14 is coupled to loop filter 16. Loop filter 16 is coupled to the VCO 18. The output of VCO 18 is communicated to frequency divider 28. The output of frequency divider 28 is communicated to the phase-frequency detector 12 as well as provided to the lock detector 30. The lock detector 30 is also supplied REFCLK so that it may produce a lock detect signal on signal line 32.

In operation, the phase detector 12 compares two input frequencies, generating an output that is a measure of their phase difference. For instance, the phase-frequency 12 detector compares REFCLK with FBKCLK and generates an error signal on signal line 24 proportional to the magnitude of the phase/frequency difference between REFCLK and FBKCLK. For purpose of illustration, the output signal of the phase detector 12 is shown as up or down pulses on signal line 24 which would typically be input into a counter (not shown), which acts as a loop filter 16, to drive the VCO 18. In another example, the phase detector 12 may output an n-bit phase error signal that can be output to a standard digital filter.

The error signal on signal line 24 is fed to the charge pump 14 to alleviate the loading of the phase detector 12 on the PLL circuitry. The charge pump 14 current controls the magnitude of the charge stored in the loop filter 16, thus converting the phase-frequency detector 12 to a control voltage input on signal line 26 to the VCO 18. The VCO 18 generates an output frequency proportional to the control voltage on signal line 26.

When the PLL 10 is locked, there is a constant phase difference (usually zero) between the REFCLK and FBKCLK and their frequencies are matched. If the two signals are equal, there will be no magnitude output on signal line 24 from the phase detector 12. If the signals differ, the phase detector 12 outputs a voltage signal, corresponding to the phase difference on signal line 24. In operation, the phase detector 12 compares the REFCLK with FBKCLK. If FBKCLK falls behind REFCLK, the phase detector 12 causes the charge pump 14 to change the control voltage, so that the VCO 18 speeds up. Likewise, if FBKCLK creeps ahead of REFCLK, the phase detector 12 causes the charge pump 14 to change the control voltage to slow down the VCO 18. The loop filter 16 smooths out the abrupt control inputs from the charge pump 14, so that the system tends towards a state where the phase detector 12 makes very few corrections. The result is a stable PLL output on signal line 34 which can be used in a variety of integrated circuit applications. One such application may be a clock generation circuit.

There are many circumstances, however, when the PLL 10 will not be able to produce a stable output on signal line 34. The lock detect 30 indicates when a stable output is or is not being output by monitoring REFCLK and FBKCLK. If there is not a stable output, lock detect 30 will produce a signal on signal line 32 corresponding to a lock condition not being met.

One such circumstance that may cause a lock condition to not be met may be REFCLK having too low or high of an input frequency. In PLL circuits, VCOs are often designed to operate in a given frequency range. If REFCLK has too low of a frequency, for example, a VCO may output a waveform that is pinned at its lowest frequency. The lowest operable frequency of the VCO may be higher in frequency than the frequency of REFCLK. Thus, the frequency of FBKCLK will be higher than REFCLK. When the lock detect 30 evaluates REFCLK and FBKCLK signals it will discriminate a difference in output frequencies and produce an output signal on signal line 32 that corresponds to a "non-lock" condition.

Figure 1B:
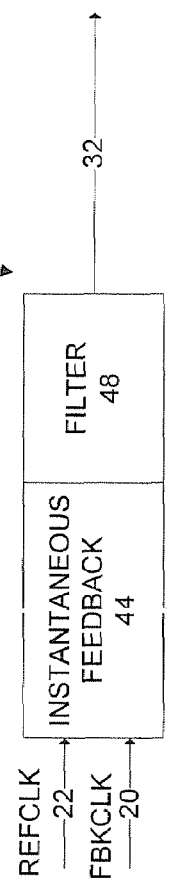
FIG. 1b is block diagram of a lock detect circuit.

As mentioned above, a lock detect circuit 30 is used to evaluate REFCLK and FBKCLK. An alternative lock detect circuit 31 is presented in FIG. 1*b*. This lock detect circuit 31 includes an unfiltered component 44 and a filter 48. Both REFCLK and FBKCLK are communicated to the unfiltered component 44. Using a delay device or conventional logic, REFCLK and FBKCLK are compared and filtered by the filter 48. Over time, a capacitor (not shown), within the filter 48, charges and produces a lock signal when the capacitor crosses a threshold voltage indicative of a lock condition. Once this occurs, the lock detect signal indicates a lock. The capacitor within the filter 48 may continue to charge, or fluctuate in stored charge but may, nevertheless, stay at or above a threshold voltage indicative of a lock condition. This is disadvantageous as SEEs, SEUs, and SETs may not be detected. Quick recovery of REFCLK after one of these events may not cause a sufficient decrease in charge in the capacitor to output a voltage level below the threshold level. These transient events are, however, still detected by lock detect 31. This detection will be described with reference to FIG. 3*a*.

In the above example, the REFCLK actually failed and a loss of lock was not accounted for. Not accounting for this error could be detrimental to circuits that rely on the PLL output signal. Eventually, other circuits that depend on the PLL output signal may fail and the only solution may be to reset an entire circuit that employs the PLL 10. If, however, the error is anticipated by an enhanced lock detect signal, only individual components within the entire circuit may need to be reset. This may provide rapid error recovery from SEE, SEU, and SET events. As mentioned previously, other detrimental events that a conventional lock detect cannot account for, besides rapid loss and recovery of REFCLK, may be a complete loss of the reference clock or a shift in phase between REFCLK and FBKCLK.

Figure 2:
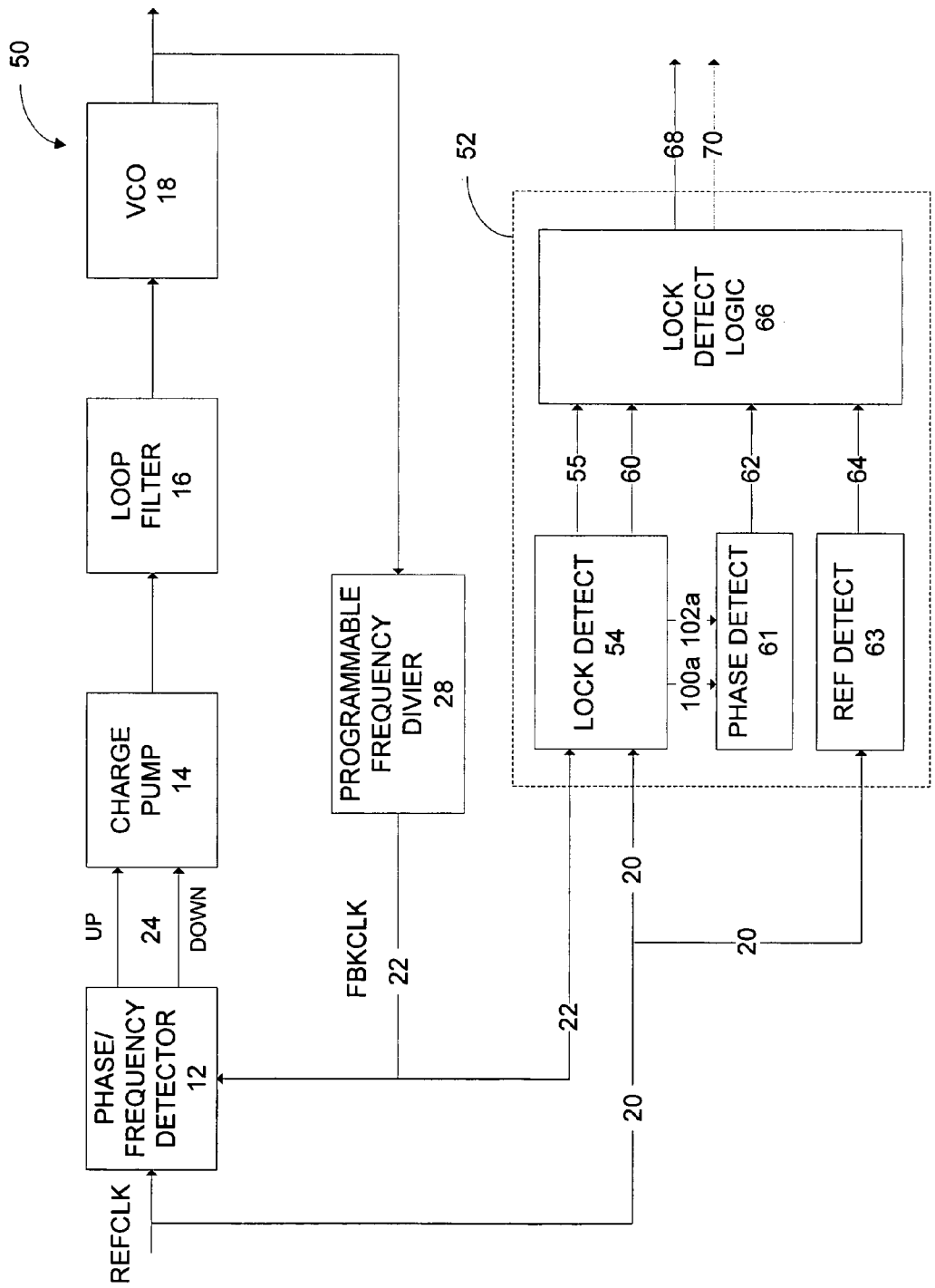
FIG. 2 is a block diagram of a PLL with improved lock detection.

In order to account for events not detected by conventional lock detect circuits, FIG. 2 shows an example PLL 50 with enhanced lock detection 52. In this example, lock detect 54 monitors REFCLK and FBKCLK to provide an extended (steady state) lock detect signal on signal line 55 and additional fast lock detect signal on signal line 60 further described with reference to FIGS. 3*a-d*. The lock detect 54 may comprise both fast lock and extended lock detect circuits, or it may output only a fast lock detect signal or an extended lock detect signal.

Also include in enhanced lock detection 52 are phase alignment detect 61 and reference clock detect 63. Phase alignment detect 61 and reference clock detect 63 produce a phase alignment detect signal on signal line 62 and a reference clock detect signal on signal line 64 respectively. An example circuit of phase alignment detect 61 is further described with reference to FIG. 4*a*. An example circuit of reference clock detect 63 is further described with reference to FIG. 5*a*.

In the example of FIG. 2, the extended lock detect signal, fast lock detect signal, phase alignment detect signal and reference clock detect signals are communicated to lock detect logic 66. Lock detect logic 66 outputs an enhanced lock detection signal on signal line 68. Lock detect logic 66 is, for example, a logical AND or NAND gate that produces a lock detect signal when each of the various lock components corroborate a locked condition. Logic 66 may also be configured to produce a multi-bit signal on signal lines 68 and 70. The multi-bit signal could indicate that an extended, or steady state, lock has been achieved but a fast lock has not, for example. Or, conversely, the multi-bit signal may indicate a fast lock has been achieved but an extended lock has not. This information could then be provided to circuit components. The information could be used to indicate when it is safe for circuit to power up, go to an idle state or reset. Lock detect logic 66 is further described with reference to FIGS. 6*a-c*.

Figure 3A:
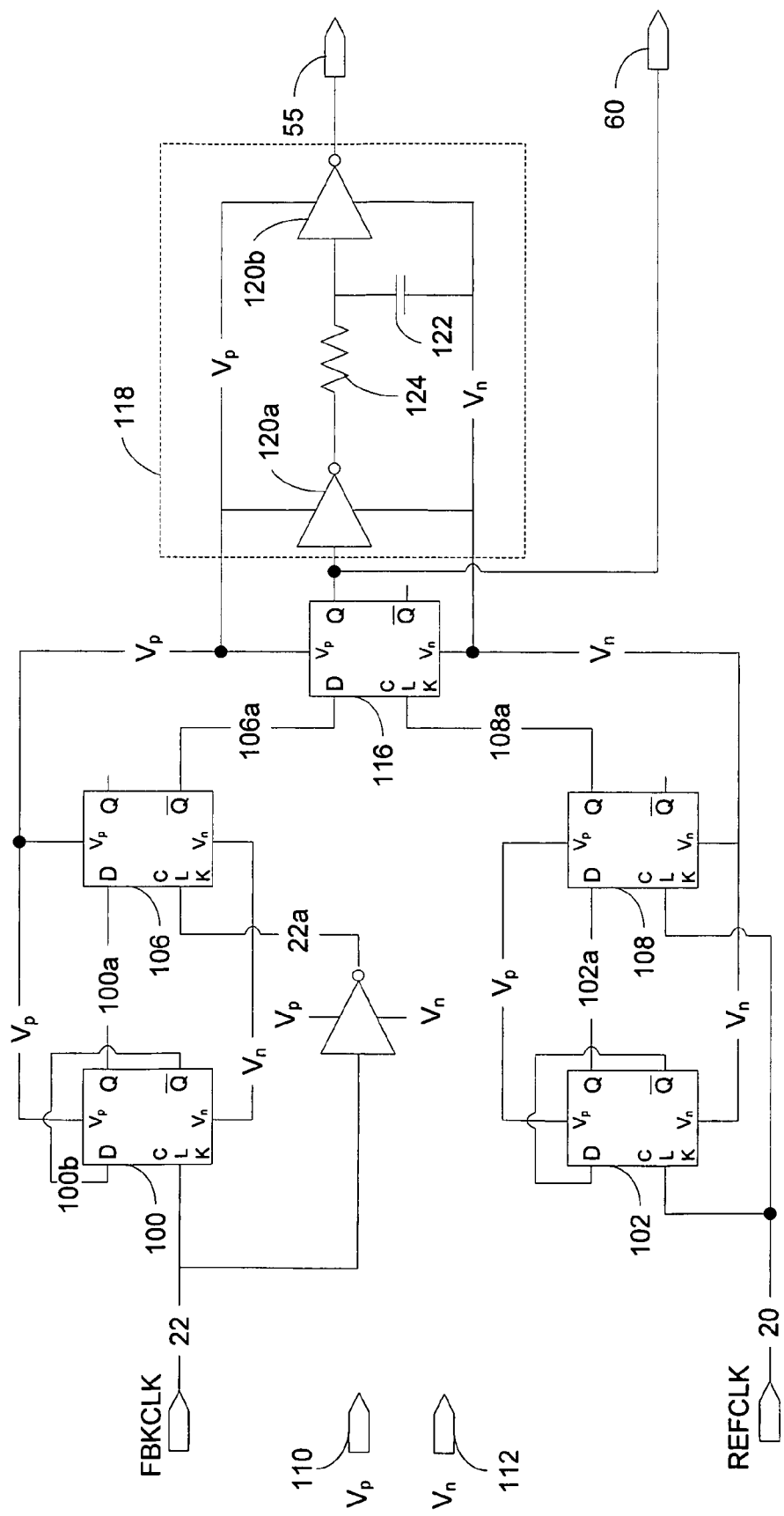
FIG. 3a is a circuit diagram of a fast and an extended lock detect circuit.

FIG. 3*a* shows a circuit diagram of an example lock detect 54 which, in operation, produces extended lock and fast lock detect signals. FBKCLK and REFCLK are communicated to D flip-flops 100 and 102 respectively. The inverted FBKCLK on signal line 22*a* is communicated to the clock of D flip-flop 106. REFCLK is communicated to the CLK input of D flip 108. The inverse output of flip-flop 106 is communicated to flip-flop 116 on signal line 106*a* and the output of flip-flop 108 is used to trigger the clock of D flip-flop 116 via signal line 108*a*. A fast lock detect signal is created at the output of D flip-flop 116.

Flip-flop 100 is configured to use FBKCLK to create a signal on signal line 100*a* with half the frequency of FBKCLK. This can be accomplished by feeding the inverse output of D flip flop 100 on signal line 100*b* into its D input. Using the inverse FBKCLK signal on signal line 22*a*, flip-flop 106 is triggered so as to shift the signal on signal line 100a ninety degrees out of phase and produce signal this signal on signal line 106a.

In a similar configuration to flip-flop 100, flip-flop 102 is configured to produce a signal on signal line 102a with half the REFCLK 20 frequency. Flip-flop 108 is also triggered by REFCLK (REFCLK is not inverted). Flip-flop 108 produces a signal on signal line 108a that is 180 degrees out of phase with the signal on signal line 102a. This is due to a slight delay in flip-flop 102, which allows the triggering of flip-flop 108 to capture a high value of the signal on signal line signal 102a before it goes low.

The resultant fast lock detect signal is illustrated in the timing diagram of FIG. 3b, the signal on signal line 106a is used as the D input and the signal on signal line 108a is used as the clock input to flip-flop 116. A "fast-lock" condition is satisfied when the flip-flop 116 is triggered according to the waveforms illustrated in FIG. 3b. The fast lock detect signal may, therefore, be used to detect a transient loss of lock. The transient loss of lock may occur for a transient amount of time. The transient amount of time may be the time associated with an SET type event, or other type of SEE or SEU event. Additionally, the transient time may be less than than the period of one REFCLK or FBKCLK cycle.

The flip-flops in this example are rising edge triggered, but any type of flip-flop or latch may be used, including multi-input flip-flops or latches. All of the logic gates and flip-flops are powered by common voltage $V_n$ 110 and power supply voltage $V_p$ 112. However, various power supply components may be used. The signals in these timing diagrams are drawn as square waveforms, it is to be understood, however, that the signals may take on a variety of waveforms, such waveform include sinusoidal, triangular or any various other shaped pulses.

To generate an extended loss of lock detect signal 55, the fast lock detect signal is communicated to a filter 118. The filter 118 may include inverters 120a-b, a capacitor 120 and a resistor 124. One of the functions of the filter 118 is to retain a stable signal that may be used for the extended loss of lock detect signal. Oscillations in voltage, such as those from the fast lock detect signal, can be dampened by the filter 118. For example, as illustrated in FIG. 3c, REFCLK signal may have a slight "jitter" 121 in its frequency. Although the REFCLK "jitters" for a short period of time, the extended lock detect signal on signal line 55 remains stable.

As illustrated in FIG. 3c, the jitter causes the capacitor 122 to charge and the voltage level 122a will begin to rise. If this voltage level stays below a threshold level 120c within inverter 118b, the extended lock detect signal will still remain high. The extended lock detect signal may only go low after a lock condition has not been met for an extended time. The extended time is longer than the transient time and it may have a time value associated with PLL upsets that are not related to SEE, SET, or SEU events. The extended time may be longer than the period of the REFCLK or FBKCLK cycles, for example.

If REFCLK is unstable for more than a few clock cycles (or at least one clock cycle), or the instability occurs frequently 123, the capacitor 122 may charge enough to cause the extended lock detect signal to go low. This is illustrated in FIG. 3d.

Both the fast lock detect signal 60 and the extended lock detect signal 55 may be very useful signals to integrated circuit components to determine when a clock has been lost, recovered, or whether it has been rapidly lost and recovered. Despite this, phase shift, or loss of reference clock may not be detected by lock detect 54 alone. FIG. 3e illustrates a phase shift 130 in clock frequencies. The phase shift 130 is about 45 degrees. Both the extended lock detect and fast lock detect signals remain high even though the phase has shifted. For applications that require PLL outputs with little or no deviation in phase from REFCLK, this may be problematic. Two separate integrated circuits that require reliable synchronization via a PLL output signal may be negatively impacted, for example.

The other potentially problematic situation, wherein REFCLK is completely lost, is illustrated in FIG. 3f. After some time "t" 131 REFCLK is lost, the signal on signal line 108a remains high and prevents any additional triggering of the flip-flop 116. The extended lock detect and fast lock detect signals remain high, despite REFCLK not cycling after time "t" 131. This too is problematic for applications relying on the PLL 10. Incorporating the phase alignment detect and reference clock detect signals into the enhanced lock detect circuit 52 will reduce or eliminate errors associated with both loss of reference clock and phase misalignment.

In order to detect errors associated with phase mismatch, FIG. 4a shows a circuit example of phase alignment detect 61, one component of the enhanced lock detection 52. Phase alignment detect circuit 61 receives as input the signal on signal line 100a (which is derived from REFCLK as shown in FIG. 3a) and the signal on signal line 102a (which is derived from FBKCLK in FIG. 3a) to an exclusive-NOR gate 140. The exclusive-NOR gate 140 compares the signals on signal lines 100a and 102a and outputs a high voltage signal when the signals are in phase with each other. Comparing the two signals need not be performed by an exclusive-NOR gate. Any logic circuit or device may be used to produce an output indicative of the two signals being in phase. Additionally, different signals may be used in lieu of the signals on signal lines 100a and 102a. REFCLK and FBKCLK may respectively be used instead of the signals on signal lines 100a and 102a.

Once the signals on signal lines 100a and 102a are compared, the output of the exclusive-NOR gate 140 (or other alternative logic) is input into a filter 141. The filter 141 may comprise a variable resistor 142, a resistor 144, a capacitor 146 and inverters 148a-b. The purpose of the filter is to store a voltage on capacitor 146 so that internal threshold levels within inverters 148a-b produce a phase mismatch output indicative of the two input clock signals being in phase.

A phase alignment detect signal, having a high voltage which is indicative of REFCLK and FBKCLK being in phase is illustrated in the timing diagram of FIG. 4b. The voltage level of the signal on signal line 150 (i.e., the voltage across capacitor 146) remains at a constant level. As long as the voltage level of the signal on signal line 150 is above a threshold level 151, the voltage level of the signal on signal line 152 (i.e., the signal output from inverter 148a) will remain low. The low voltage at inverter 148a will keep the output of inverter 148b on signal line 62 high. This high voltage level represents a phase match.

As discussed above the filter 141 may include a variable resistor 142. The variable resistor may be used to "tune" the phase alignment detect signal on signal line 150 so that a certain margin of phase mismatch is allowed. For example, a high frequency PLL may only be able to generate a FBKCLK signal within a 15 degree phase margin of error when compared to the original REFCLK 20. Variable resistors may allow the phase mismatch detection component of the enhanced lock detect 52 to be tuned to a specific PLL. This provides a degree of versatility as well application specific design to the PLL 10. A variable capacitor (not shown) may also be used to tune phase detect 61.

If the phase mismatch between the signals on signal lines 100*a* and 102*a* is small, as shown in the timing diagram FIG. 4*c*, the phase alignment detect signal on signal line 62 may still remain high. However, if a variable resistor is adjusted, or a different circuit for phase detect 61 is used, small phase differences may result in a low phase alignment detect signal. The output of phase detect 61 and the tolerances of the phase alignment detect signal are dependent on the designed RC characteristics of the circuit. External circuit components, such as those that employ the PLL 10 may provide direct feedback to a variable resistor or capacitor. For example, one such external circuit may have different operating modes. One mode may be an active mode. Another mode may be a standby mode. The active mode may require a tight tolerance on phase mismatch, while the stand by mode may not. The circuit could adjust the RC parameters of the filter 141 to create a tight tolerance on phase mismatch when in active mode. When the circuit switches to a standby mode, the tolerances could be raised. This may prevent nuisance phase mismatch error signals when a phase mismatch would not directly impact the circuit.

If an error event does occur, the phase alignment detect signal will go low. The timing diagram of FIG. 4*d* illustrates a low voltage level of the signal on signal line 150 that results in a low voltage level of the phase alignment detect signal 62. In this example, the output from the exclusive-NOR gate 140 has enough phase mismatch to prevent a voltage level that is about equal to or greater than the threshold level 151 from being reached on capacitor 146. Basically, not enough charge is stored on capacitor 146 to overcome threshold level 151. The result is that inverter 148*a* outputs a low voltage signal on signal line 152. The low voltage signal on signal line 152 is then converted to a high voltage.

Similar to the circuits within lock detect 54, the logic gates and circuit components are powered by common voltage $V_n$ 110 and power supply voltage $V_p$ 112. It is understood, however, that other power supply components may be used.

Figure 5A:
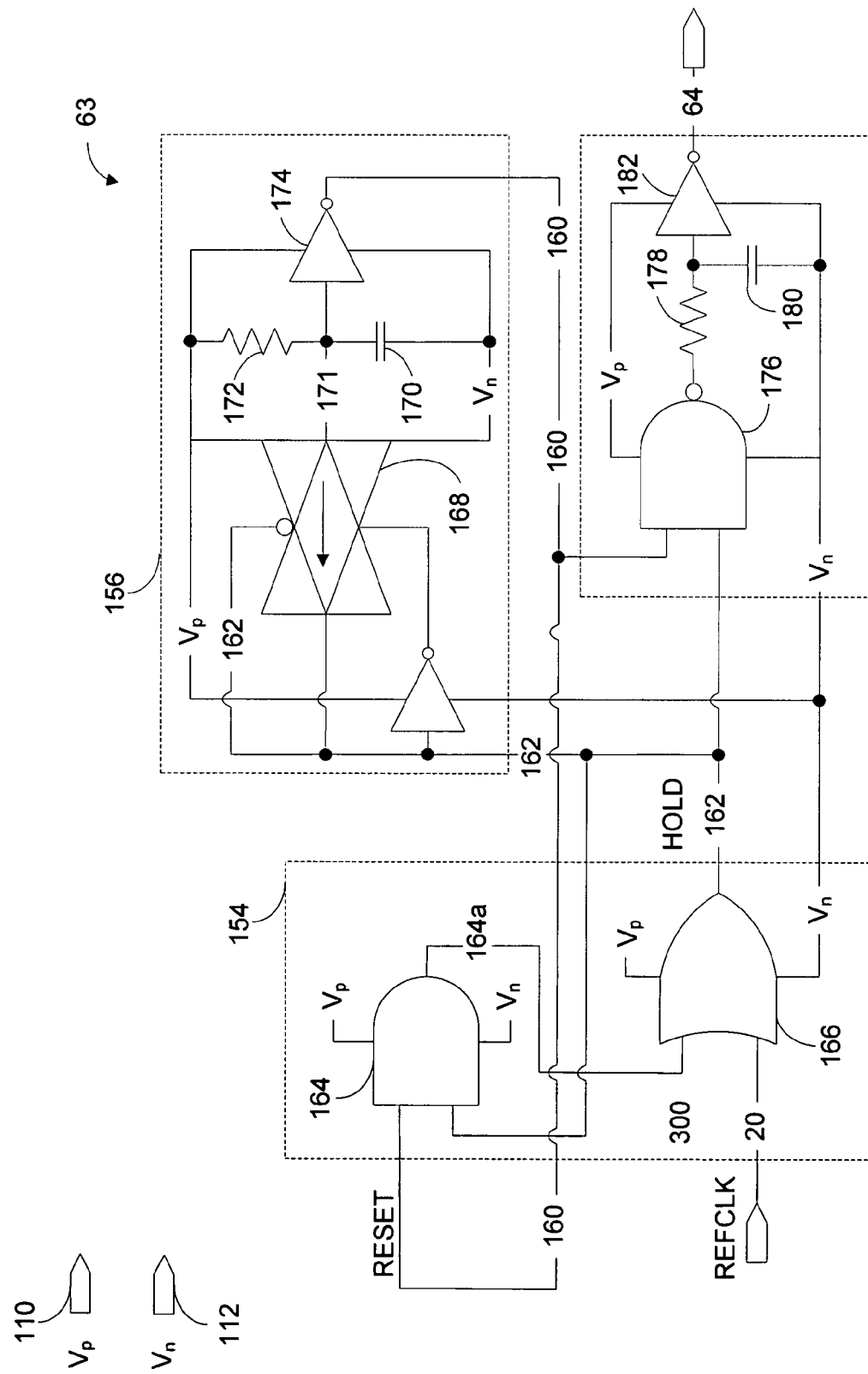
FIG. 5a is a circuit diagram of a reference clock detect circuit.

Besides detecting phase mismatch, it is also beneficial to detect when REFCLK has been lost. The schematic diagram in FIG. 5*a* illustrates a circuit that performs one example of reference clock detect 63. Overall, the reference clock detect 63 receives REFCLK and a reference clock detect signal is generate on signal line 64. In this example, when REFCLK is detected the loss of reference clock detect signal is high. When the reference clock is lost, the signal goes low. The loss of REFCLK will be further described with reference to FIGS. 5*b-c*.

In order to detect a reference clock, the circuit example of reference clock detect 63 comprises three components. Namely, these components are a hold circuit 154, a reset circuit 156, and a filter 158.

The first component, the hold circuit 154, receives a reset signal (RESET) on signal line 160 and REFCLK as input. A hold signal (HOLD) is output on signal line 162. RESET and HOLD are input into AND gate 164 to produce an output signal on signal line 164*a*. The signal on signal line 164*a* and REFCLK are communicated to OR gate 166. HOLD is the result of a logical OR operation performed on REFLCK and the signal on signal line 164*a*.

In terms of operation, when REFCLK goes high, OR gate 166 will output a high signal, this results in HOLD having a high value. Internal to hold circuit 154, HOLD is communicated to AND gate 164. When both RESET and HOLD are high, a high voltage level of the signal on signal line 164*a* will result. The signal on signal line 164*a* sets OR gate 166 so that it will maintain a high output.

Under normal operation, if the signal on signal line 164*a* were to be low, HOLD would follow REFCLK. That is, when REFCLK is high, HOLD is high and when REFCLK is low, HOLD is low. However, as described above, when the signal on signal line 164*a* is high, OR gate 166 retains a high output. Thus, once REFCLK is detected, HOLD will remain high.

To change HOLD to a low voltage, RESET may be switched to a low value. When RESET goes low, the signal on signal line 164*a* will also go low. When REFCLK cycles low, OR gate 166 produces a low output signal. Consequently, HOLD will be low. If the hold circuit 154 receives a low RESET signal periodically it can be used to verify if REFCLK is cycling. Without a periodic "reset", the hold circuit may only detect the first cycle of a reference clock.

To generate a low periodic RESET, reset circuit 156 is used. Reset circuit 156 receives HOLD as input and outputs RESET. HOLD is coupled to a transmission gate 168. HOLD and its inverse are coupled to gate terminals of the transmission gate 168. HOLD is also coupled to a transmission node of transmission gate 168. A capacitor 170, a resistor 172 and an inverter 174 are coupled to another transmission node of transmission gate 168.

A periodic pulse on RESET is generated by using transmission gate 168 to charge and discharge capacitor 170. As the voltage on capacitor 170 passes an internal threshold level of inverter 174, a low pulse on RESET will be generated.

To charge and discharge capacitor 170, HOLD is used. Normally, when REFCLK has been idle or HOLD is low, capacitor 170 is not holding a charge, or is discharging. Thus, a low voltage is present across capacitor 170, and inverter 174 outputs a high RESET. Under this condition, capacitor 170 is prevented from accumulating. A low HOLD creates a "short" within transmission gate 168 and the low voltage of HOLD is passed directly to capacitor 170, whereby charge is prevented from accumulating.

However, when HOLD goes high, transmission gate 168 is "open" and capacitor 170 will begin to charge. When capacitor 170 reaches a threshold level within inverter 174, a low RESET will be output.

Turning again to the hold circuit 154, the low RESET creates a low signal on signal line 164*a* signal at the output of AND gate 164. When REFCLK goes low, OR gate 166 will produce a low HOLD. This low HOLD, will then allow capacitor 170 to discharge via transmission gate 168. Discharging will continue until HOLD goes high again. Thus, a periodic pulse is created on RESET.

The pulse, or the charging and discharging rate of capacitor 170 may be configured by design of the RC characteristics of reset circuit 156. This may be done by choice of resistor 172 or capacitor 170.

Lastly, a filter 158 is used to discriminate RESET and HOLD. Typically, when a reference clock is not cycling, RESET is high and HOLD is low. In contrast, when a reference clock is cycling RESET will periodically go low but for the majority of a reference clock period, RESET will be high. In a similar manner, HOLD will periodically go low but will also remain high for a majority of the reference clock period.

To create the reference clock detect signal, RESET and HOLD are both input into the filter 158. The filter 158 includes a NAND gate 176, a resistor 178, a capacitor 180, and an inverter 182. NAND gate 176 is used to compare RESET and HOLD. Resistor 178 and capacitor 180 are used in combination to filter noise and store a charge. When the voltage across capacitor 180 is high, the inverter will output a low voltage indicating that REFCLK is not cycling. Therefore, when RESET is high and HOLD is low (as is the case when a REFCLK is not cycling), the output of NAND gate 176 will be high and capacitor 180 will charge. If the voltage across capacitor 180 is or becomes higher than an internal threshold voltage within capacitor 180, a low reference clock detect signal will be output from inverter 182. This will indicate that REFCLK is not cycling.

If, however, RESET and HOLD are high (or high for the majority of the period of REFCLK), NAND gate 176 will output a low voltage. This low voltage will cause capacitor 180 to discharge. When the voltage across capacitor 180 drops below the internal threshold level within inverter 182, a high reference clock detect signal will be output. The high reference clock detect signal indicates that RFKCLK is cycling.

FIGS. 5*b-c* illustrate two example timing diagrams of lost RFKCLK detection. In FIG. 5*b*, REFCLK is lost during a low cycle at a time "t" 183*a*. A pulse from RESET is periodically sent when capacitor 170 reaches a threshold voltage level within inverter 180. When the low RESET pulse is sent, the signal on signal line 164*a* from AND gate 164 goes low. This results in HOLD going low. After time "t" 183*a*, capacitor 170 will not be able to charge as REFCLK will not "set" hold circuit 154. Eventually, loss of the reference clock detect signal will also go low as capacitor 180 will charge above a threshold level within inverter 182. As described above, the charging and discharging of capacitor 170 may be shaped by the RC characteristics of reset circuit 156. One shape of the charging and discharging characteristics of reset circuit 156 is illustrated by a signal trace 170*a* that occurs on signal line 171. Trace 170*a* represents the voltage across capacitor 170. In contrast, in FIG. 5*c*, trace 170*b* represents a capacitor 170 (or reset circuit 156) with different charging and discharging characteristics.

Also demonstrated in FIG. 5*c* is the loss of REFCLK on a high cycle after a certain time "t" 183*b*. In this example, capacitor 170 will continue to charge until a threshold voltage level is reached. RESET will stay high and HOLD will stay low. Again, the reference clock detect signal will go low when capacitor 180 charges above a threshold voltage level. The timing diagrams of FIGS. 5*b-c* may vary depending on a circuit designer's preference or design.

Figure 6A:
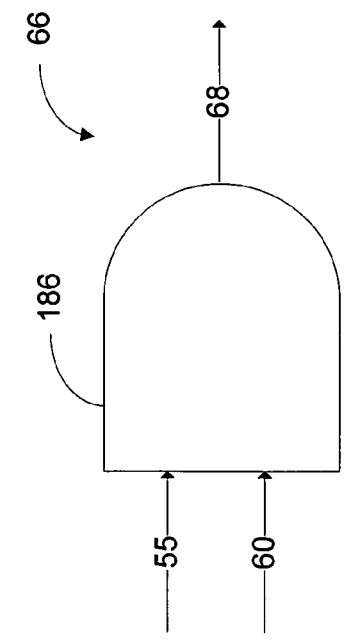
FIG. 6a is a circuit diagram of a lock detect logic circuit.
Figure 6B:
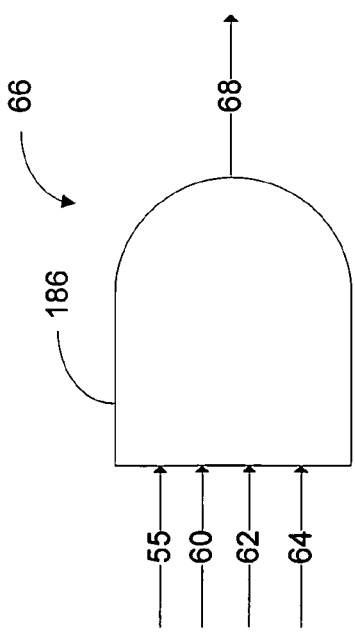
FIG. 6b is a circuit diagram of another lock detect logic circuit.

Once all four signals have been calculated, extended lock detect, fast lock detect, phase alignment detect, and reference clock detect signals may all be combined in lock detect logic 66. As previously illustrated in FIG. 2, all four signals are input into lock detect logic 66 to generate enhanced lock detect signal on signal line 68. As illustrated in FIG. 6*a*, the lock detect logic 66 may comprise an AND gate 186. Other examples, however, may only use two of the input signals. For example, as illustrated in FIG. 6*b*, the lock detect logic circuit comprises an AND gate 186 which receives extended lock detect and fast lock detect signals. These two signals may be the only signals used to create an enhanced lock detect signal. Other examples may also comprise several logical operations. The lock detect logic 66 may also output more than one lock detect signal. Two signals, on signal lines 68 and 70, may be used to convey additional information, or status, about an enhanced lock detect circuit 52 or a PLL 10.

Figure 6C:
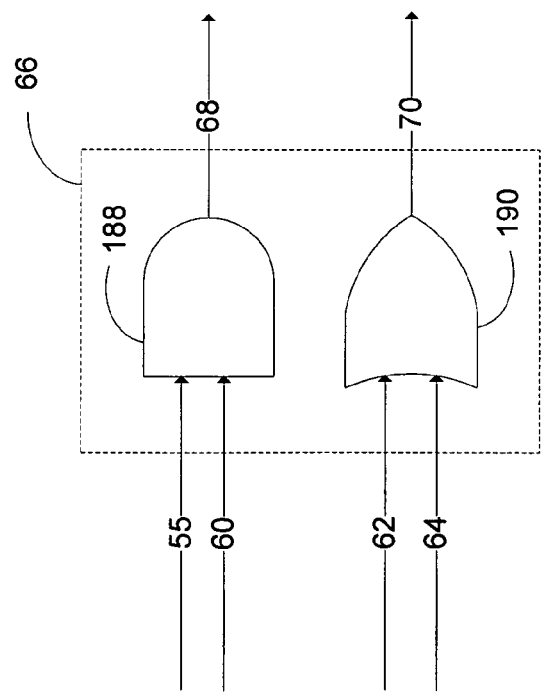
FIG. 6c is a circuit diagram of yet another lock detect logic circuit.

FIG. 6*c* is one example of a multi-bit output lock detect logic 66. Wherein, the lock detect logic 66 comprises an AND gate 188 and an OR 190 gate. The two bit output on signal lines 68 and 70 of lock detect logic 66 in FIG. 6*c* may output information about PLL 10 according to Table 1.

TABLE 1

| Enhanced lock detect with multi-bit output | | | | | |
|---|---|---|---|---|---|
| Extended lock detect | Fast lock detect | Phase misalignment detect | Reference Clock detect | Enhanced lock detect 1 | Enhanced lock detect 2 |
| 1 | 1 | 1 | 1 | 1 | 1 |
| 1 | 1 | 1 | 0 | 1 | 0 |
| 1 | 1 | 0 | 1 | 1 | 0 |
| 1 | 1 | 0 | 0 | 1 | 0 |
| 1 | 0 | 1 | 1 | 0 | 1 |
| 0 | 1 | 1 | 1 | 0 | 1 |
| 1 | 0 | 1 | 0 | 0 | 0 |

In the above examples, OR gate 190 determines if a PLL 10 has lost REFCLK or if it has gone out of phase. AND gate 188 is used to determine if the fast lock detect and extended lock detect signals are high. Using a multi-bit signal may allow a circuit designer to pass different instructions to applications that depend on a PLL 10 or components within the PLL 10. For example, an SET may cause REFCLK to shift slightly out of phase. A multi-bit signal may be sent to circuit components to go to idle state until phase realignment is achieved (represented in Table 1 as "1","0"). However, if the extended lock detect or fast lock detect signals go low, the multi-bit signal sent to circuit components may be a "reset" (represented in Table 1 as "1","1" or "1", "0"). A circuit component's response to an SET type event may be dependent on the type of enhanced lock detect signal generated.

The PLL and lock detection of can take many forms. Many of the logical operations can be formed by various combinations of a plurality of logic gates and components. For many applications examples of the enhanced lock detect 54 or PLL may be implemented on a DSP (Digital Signal Processor), ASIC or FPGA (Field Programmable Gate Array). In one example, the lock detect is realized in an application specific integrated circuit or "ASIC" customized to perform specific functions for a particular use or uses. Other examples could also be implemented in software PLLs. These PLLs implement a PLL using software equivalents for each of the blocks. These PLLs would typically be run on a DSP or microprocessor. Software PLLs are becoming more popular mainly due to the availability of cheap and easy to program DSPs.

As such, the above-described apparatus and methods may be embodied as software code, for example on a carrier medium such as a disk, CD- or DVD-ROM, programmed memory such as read only memory (Firmware), or on a data carrier such as an optical or electrical signal carrier. Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog or VHDL (Very high speed integrated circuit Hardware Description Language). As the skilled person will appreciate, the code may be distributed between a plurality of coupled components in communication with one another. Where appropriate, the examples may also be implemented using code running on a field-(re-)programmable analog array or similar device in order to configure analog hardware.

The above examples describe a PLL with enhanced lock detection. An extended lock detect, fast lock detect, phase alignment detect, and reference clock detect signals may be combined in various combinations to generate an enhanced lock detect signal. The enhanced lock detect signal may be generated from a lock detect logic circuit which performs logic operations on one or more of the above signals. The enhanced lock detect signal may be used by circuitry within a PLL or external to a PLL to determine lock status of the PLL. It should be understood that the illustrated examples are examples only and should not be taken as limiting the scope of the present invention. The claims should not be read as limited to the described order or elements unless stated to that effect. Therefore, all examples that come within the scope and spirit of the following claims and equivalents thereto are claimed as the invention.

We claim:

1. A Phase Locked Loop (PLL), comprising:
   an extended lock detect circuit to monitor extended loss of lock, the extended lock detect circuit, in operation, monitoring a reference clock signal and a feedback clock signal and generating an extended lock detect signal when the reference clock and feedback clock signals are not synchronized for a first predetermined time; and
   a fast lock detect circuit to monitor temporary loss of lock due to transient events, the fast lock detect circuit, in operation, monitoring the reference clock and feedback clock signals and generating a fast lock detect signal when the reference clock and feedback clock signals are out of phase for a transient amount of time.
   a phase alignment detect circuit comprising (i) an XOR logic gate and (ii) a first filter, having a first resistor coupled to a first capacitor, wherein the phase alignment detect circuit generates a phase alignment detect signal when the reference clock and feedback clock signals have a phase difference greater than a predetermined phase, and wherein the predetermined phase depends on a resistance value associated with the first resistor and a capacitance value associated with the first capacitor.

2. The PLL as in claim 1, wherein the first predetermined time is establish by a time constant of a second filter, the second filter coupled to receive the fast lock detect signal, and the second filter outputting the extended lock detect signal.

3. The PLL as in claim 2, wherein the second filter comprises a second resistor coupled to a second capacitor, the second resistor and second capacitor coupled to receive the fast lock detect signal, and the first predetermined time depending on a resistance value associated with the second resistor and a capacitance value associated with the second capacitor.

4. The PLL as in claim 1, wherein the transient events are Single Event Transient (SET) type events.

5. The PLL as in claim 1, wherein the phase alignment detect circuit, in operation, monitors a difference in phase between the reference clock and feedback clock signals.

6. The PLL as in claim 5, wherein:
   the XOR logic gate is coupled to receive the reference clock and feedback clock signals, and, in operation, the XOR logic gate outputting a signal that indicates if the reference clock and feedback clock signals have an equivalent voltage level; and
   the filter is coupled to receive the output signal from the XOR logic gate and produce the phase alignment detect signal.

7. The PLL as in claim 1, wherein the first capacitor is a variable capacitor.

8. The PLL as in claim 1, wherein the first resistor is a variable resistor.

9. The PLL as in claim 1, further comprising a reference clock detect circuit, the reference clock detect circuit, in operation, monitoring the reference clock signal and generating a reference clock detect signal when the reference clock signal is detected.

10. The PLL as in claim 5, further comprising a reference clock detect circuit, the reference clock detect circuit, in operation, monitoring the reference clock signal and generating a reference clock detect signal when the reference clock signal is detected.

11. The PLL as in claim 9, wherein the loss of reference clock detect circuit comprises:
   a logic circuit coupled to receive the reference clock signal and a reset signal, the logic circuit producing a hold signal when the reference clock signal transitions to a high voltage level;
   a reset circuit coupled to receive the hold signal, the reset circuit, in operation, producing the reset signal when the reference clock signal is at a low voltage level for a second predetermined time; and
   a third filter coupled to receive the hold and reset signals, the third filter, in operation, outputting a high reference clock detect signal when the hold and reset signals have a high voltage level for a third predetermined time.

12. The PLL as in claim 11, wherein the reset circuit comprises:
   a transmission gate coupled to receive the hold signal, the transmission gate, in operation, outputting a low voltage signal when the hold signal is at a high voltage level;
   a third capacitor coupled to receive an output of the transmission gate, the third capacitor, in operation, producing the reset signal and storing a charge when the transmission gate is not outputting the low voltage signal; and
   a third resistor coupled to the third capacitor and the transmission gate.

13. The PLL as in claim 12, wherein the second predetermined time depending on a resistance value associated with the third resistor and a capacitance value associated with the third capacitor.

14. The PLL as in claim 11, wherein the third filter comprises:
   a NAND type logic gate coupled to receive the hold and reset signals;
   a fourth resistor having a first terminal coupled to an output of the NAND gate; and
   a fourth capacitor coupled to a second terminal of the fourth resistor, the capacitance value of the fourth capacitor and the resistance value of the fourth resistor determining the third predetermined time.

15. The PLL as in claim 1, further comprising lock detect logic coupled to receive the fast lock detect and extended lock detect signals, and, in operation outputting an enhanced lock detect signal indicating a fast and extended lock status of the PLL.

16. The PLL as in claim 15, wherein the lock detect logic comprises an AND type logic gate coupled to receive the fast lock detect and extended lock detect signals and output the enhanced lock detect signal.

17. The PLL as in claim 5, further comprising lock detect logic, the lock detect logic coupled to receive the fast lock detect, extended lock detect, and phase alignment detect signals, and, in operation output an enhanced lock detect signal, the enhanced lock detect signal indicating fast and extended lock and phase alignment status of the PLL.

18. The PLL as in claim 10, further comprising lock detect logic, the lock detect logic coupled to receive the fast lock detect, extended lock detect, phase alignment detect, and reference clock detect signals, and, in operation output an enhanced lock detect signal, the enhanced lock detect signal indicating fast and extended lock, phase alignment, and reference clock detect status of the PLL.

19. A method of detecting lock in a Phase Locked Loop (PLL), the method comprising:

receiving reference clock and feedback clock signals at a lock detect circuit, the lock detect circuit comprising a fast lock detect circuit and a first filter, the fast lock detect circuit outputting a fast lock detect signal, the first filter receiving the fast lock detect signal and outputting an extended lock detect signal when lock is lost for an extended amount of time, the extended amount of time being longer than a clock cycle associated with the reference clock signal;

receiving the reference clock and feedback clock signals at a phase alignment detect circuit, the phase alignment detect circuit comprising a second filter, the second filter comprising a resistor coupled to a capacitor, and the second filter outputting a phase alignment detect signal when the reference clock and feedback clock signals have a phase difference greater than a predetermined phase, the predetermined phase depending on a resistance value associated with the resistor and a capacitance value associated with the capacitor;

if lock is lost for a transient amount of time, indicating a transient loss of lock on the fast lock detect signal, the transient amount of time being less than the extended amount of time; and if the transient amount of time expires and lock is regained, indicating a lock condition on the fast lock detect signal.

20. The method of claim 19, wherein the transient loss of lock is induced by a Single Event Transient (SET) type event.

21. The method of claim 20, further comprising:

if lock is lost for a time greater than the extended time, indicating an extended loss of lock on the extended loss of lock detect signal.

22. A method of detecting lock in a Phase Locked Loop (PLL), the method comprising:

receiving reference clock and feedback clock signals at a lock detect circuit, the lock detect circuit outputting an extended lock detect signal when lock is lost for an extended amount of time, the extended amount of time being longer than a clock cycle associated with the reference clock signal;

receiving the reference clock and feedback clock signals at a phase alignment detect circuit, the phase alignment detect circuit comprising a filter, the filter comprising a resistor coupled to a capacitor, and the filter outputting a phase alignment detect signal;

receiving the extended lock detect signal and the phase alignment detect signal at a logic circuit, the logic circuit, in operation, outputting an enhanced lock detect signal; and if the reference clock and feedback clock signals deviate beyond a predetermined threshold, indicating that the reference clock and feedback clock signals have deviated on the phase alignment detect signal, and indicating a non-lock condition on the enhanced lock detect signal.

23. The method as in claim 22, further comprising adjusting the predetermined threshold by adjusting a resistance value of the resistor.

24. The method as in claim 22, further comprising adjusting the predetermined threshold by adjusting a capacitance value of the capacitor.

* * * * *